(12) United States Patent
Adams et al.

(10) Patent No.: US 8,487,699 B2
(45) Date of Patent: Jul. 16, 2013

(54) INDUCTIVE-ELEMENT FEEDBACK-LOOP COMPENSATOR

(75) Inventors: Douglas Jay Kozak Adams, Potomac, MD (US); Rahul Sarpeshkar, Arlington, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 164 days.

(21) Appl. No.: 13/188,986

(22) Filed: Jul. 22, 2011

(65) Prior Publication Data

US 2013/0021097 A1    Jan. 24, 2013

(51) Int. Cl.
*H03F 1/36* (2006.01)

(52) U.S. Cl.
USPC ............. 330/107; 330/252; 330/69; 330/302

(58) Field of Classification Search
USPC .................................. 330/107, 252, 69, 302
See application file for complete search history.

(56) References Cited

U.S. PATENT DOCUMENTS

| | | | |
|---|---|---|---|
| 3,067,390 A * | 12/1962 | Wolcott | 330/126 |
| RE29,080 E | 12/1976 | Kiko | |
| 4,268,785 A | 5/1981 | Svendsen | |
| 4,777,430 A | 10/1988 | Schabaner | |
| 5,451,906 A | 9/1995 | Kaltenecker | |
| 5,994,956 A | 11/1999 | Concorso | |
| 6,023,196 A | 2/2000 | Ashby et al. | |
| 6,573,788 B2 | 6/2003 | Oppelt | |
| 7,129,801 B2 * | 10/2006 | Wu | 331/177 V |
| 7,132,820 B2 * | 11/2006 | Walters et al. | 323/288 |
| 8,129,972 B2 * | 3/2012 | Audy | 323/285 |

FOREIGN PATENT DOCUMENTS

EP    0 689 283 A1    12/1995

OTHER PUBLICATIONS

International Search Report of the ISA for PCT/US2011/051678 dated May 30, 2012.
Written Opinion of the ISA for PCT/US2011/051678 dated May 30, 2012.
Brodersen; "More on Op Amps Telescopic and Folded Cascode;" EECS140 Analog Circuit Design; Lecture 22; Fall 2002; 24 pages.
Cobb; Experiment 4—Lead-Lag Compensation; www.ece.wisc.edu/~cobb/ECE409/Exp4.pdf; pp. 25-34.
Intersil; Feedback, Op Amps and Compensation; Application Note; AN9415.3; Nov. 1996; pp. 1-12.
Lee; "The Design of CMOS Radio-Frequency Integrated Circuits;" Second Edition; 2003; Section 12.3; pp. 373-380.
Lee; "The Design of CMOS Radio-Frequency Integrated Circuits;" Second Edition; 2003; Section 19.6; pp. 716-761.
Lundberg; "Internal and External Op-Amp Compensation: A Control-Centric Tutorial;" American Control Conference; Jun. 30-Jul. 2, 2004; pp. 5197-5211.
Roberge; "Operational Amplifiers: Theory and Practice;" 1975; Section 1.2; pp. 2-13.
Roberge; "Operational Amplifiers: Theory and Practice;" 1975; Section 13.1; pp. 557-570.

* cited by examiner

*Primary Examiner* — Patricia Nguyen
(74) *Attorney, Agent, or Firm* — Daly, Crawley, Mofford & Durkee, LLP

(57) ABSTRACT

Described is an inductive compensating network coupled between the differential inputs of an operational amplifier circuit. The inductive compensating network includes at least one inductive element having an inductance value selected so as to provide proper compensation of the operational amplifier circuit. Also described is a feedback compensation scheme which adjusts loop characteristics by introducing zeros into a system with the addition of inductive or capacitive elements in a feedback path.

20 Claims, 14 Drawing Sheets

INDUCTIVE-ELEMENT FEEDBACK-LOOP COMPENSATOR

GOVERNMENT RIGHTS

This invention was made with government support under Grant No. R01 NS056140 awarded by the National Institutes of Health and under Grant No. N00014-09-1-1015 awarded by the Office of Naval Research. The government has certain rights in this invention.

FIELD OF THE INVENTION

The concepts described herein relate to feedback systems with electrical components, and more particularly to operational amplifiers.

CROSS REFERENCE TO RELATED APPLICATIONS

No applicable.

BACKGROUND OF THE INVENTION

As is known in the art, an operational amplifier (or more simply "an op-amp") is a DC-coupled high-gain electronic voltage amplifier having a differential input and typically having a single-ended output. An op-amp produces an output voltage that is larger (e.g. often hundreds or thousands of times larger) than a voltage difference presented at its input terminals. Op amps are important building blocks for a wide variety of electronic circuits. All op amps are compensated. Some are compensated with internal components thus saving a designer time and money. Many op amps are not compensated internally because leaving out the compensation gives the designer an extra degree of freedom. For proper use these op amps must have some kind of external compensation or they will oscillate. Furthermore, many internally compensated op amps are used in systems where additional compensation is necessary for proper operation.

One type of compensation is called "dominant pole" compensation. Another type of compensation is called "lag compensation". A further type of compensation is called "lead compensation." Lead compensation involves putting both a zero and then a pole into the loop transfer function. Conventional operational amplifier implementations rely on capacitors to provide the zeros required to implement all of these compensators. Many conventional systems are limited by internal capacitances which fundamentally limit the available compensation bandwidth. Furthermore, in conventional lead compensation schemes, adjusting the compensator fundamentally alters the closed loop behavior of the entire system.

FIG. 1 shows a non-inverting prior art compensation system that uses both inductors and capacitors to provide two lead compensators for the same op amp FIG. 2 is a block diagram associated with the circuit of FIG. 1. As can be seen from FIGS. 1 and 2, in a conventional implementation, a resistor $R_1$ and inductor $L_1$ are serially coupled to a negative input of an op amp 2 having a gain A and having a feedback network comprised of a resistor $R_2$ and a capacitor $C_1$. The feedback network provides compensation (and in particular, lead compensation) through frequency domain interaction of the resistors and capacitor and inductor.

From FIG. 2 it is apparent that changing values of the resistors $R_1$ and $R_2$, the capacitor $C_1$, or the inductor $L_1$ allows for compensation of the feedback loop through block 16. However, it should be noted that block 10 is the reciprocal of block 16, and therefore any changes made to compensate the circuit also change the closed loop transfer function of the system through its effect on block 10.

The explicit coupling of the compensator and the closed loop gain of the system complicates the design and limits the usefulness of the standard lead compensator implementation.

FIG. 3 illustrates a prior art compensation system for an inverting amplifier that uses both inductors and capacitors to provide two lead compensators for the same op amp.

FIG. 4 illustrates a prior art non-inverting compensation system that uses a resistor and capacitor shunt coupled between differential op amp inputs to provide lag compensation.

SUMMARY OF THE INVENTION

In accordance with the concepts, circuits and techniques described herein, an operational amplifier (op amp) circuit having differential inputs and an output(s) includes a compensating network having an inductive element coupled between the differential inputs of the op amp circuit.

With this particular arrangement, a fully compensated operational amplifier circuit having inductive compensation is provided. In one exemplary embodiment, the inductive element of the compensating network includes an inductor having an inductance value selected so as to stabilize the system with a lead compensator. In other embodiments other circuits which emulate inductive behavior may be used, For example, a wide variety of different implementations of gyrator circuits that emulate inductive behavior with capacitors, amplifiers and other circuit elements may be used. The concepts, circuits and techniques described herein may be used to compensate poorly designed systems after they are fabricated and also to stabilize feedback around high order filters commonly found in phase-locked loops (PLLs), delay-locked loops (DLLs), and sigma delta converters. As well as systems designed to drive capacitive loads.

In accordance with a further embodiment of the concepts, circuits and techniques described herein, a circuit includes an op amp having a compensating network which includes an inductive element coupled between differential inputs thereof and an additional compensation network connected between the output of the op amp and its inverting terminal. With this particular arrangement, a fully compensated operational amplifier circuit having inductive compensation is provided. The inductive element coupled between differential inputs may be provided in whole or in part from an inductor or from any other type of circuit element or any combination of circuit elements which emulate inductive behavior including, but not limited to gyrator circuits. Thus, the inductive element may be provided from reciprocal or non-reciprocal circuit elements or from a combination of both reciprocal or non-reciprocal circuit elements. In one embodiment, a gyrator circuit that emulates inductive behavior using capacitors, amplifiers and other circuit elements may be used. In one embodiment, an inverting topology with a lag-lead shunt compensator and two additional lead compensators may be provided. In another embodiment, a non-inverting topology with a lag-lead shunt compensator and a single additional lag compensator may be provided. Utilizing the same compensators it is possible to generate any combination of independent lag and lead compensators—up to three of each—around a single amplifier. It is important to note that the various compensators can be set independently, and are not limited by each other.

Furthermore, the second above embodiment provides up to three compensating zeros for the single op amp system. In such an embodiment, the additional zeros provide an opportunity to compensate systems that would otherwise be beyond the capability of one, or two compensators.

In a further embodiment, the inductive compensating network is fabricated on the circuit along with the amplifier, thus providing a compensated circuit that can be quickly mass-produced and is relatively inexpensive compared with compensated circuits having substantially the same functionality. This is particularly useful because the series resistance of on-chip inductors can be folded into the resistance needed for proper compensation.

In a further embodiment the inductive compensator is placed within a cascaded series of amplifiers, thus providing higher performance systems with compensators that are invisible to the end user. It should be appreciated that the first compensating network can be placed in an integrated circuit package of an amplifier, but by measuring the impedance from the terminals the end user can determine the existence and values of the compensation network. However, for cascaded amplifiers it may not be possible to determine what type of compensation was used internally in an amplifier.

In accordance with a still further aspect of the invention, described herein is the development of a feedback system whereby a zero is introduced into the loop transmission by the addition of an inductive element between differential input terminals. Also described is the development of a feedback system whereby a zero is introduced into the loop transmission by the addition of inductive elements in a feedback network. Also described is the development of a feedback system whereby a pole is introduced into the loop transmission by the addition of inductive elements in the feedback network. Also described is the development of a feedback system whereby multiple poles and zeros are introduced into the loop transmission through the combined application of the above techniques. The above circuits and techniques can be used to: compensate poorly designed systems after they have designed and/or fabricated; improve the phase margin of existing feedback systems; and stabilize feedback around high order filters commonly found in phase locked loops (PLLs), delay locked loops (DLLs), and sigma delta converters. As well as systems designed to drive capacitive loads.

In accordance with a still further aspect of the concepts described herein, a circuit includes an operational amplifier having differential inputs and at least one output; and an inductive compensating network coupled between the differential inputs of the operational amplifier circuit. In one embodiment, the inductive compensating network includes at least one inductive element having an inductance value selected so as to provide compensation of the operational amplifier.

In one embodiment, the circuit further includes at least one additional compensation network coupled between an operational amplifier output and the inverting terminals of the operational amplifier with each of the at least one additional compensation networks providing additional zeros necessary for proper compensation.

In one embodiment, the additional compensation network provides compensation independent of the inductive compensating network coupled between differential inputs of said operational amplifier.

In one embodiment, the inductive compensation network and at least one of the at least one additional compensating networks are combined to provide three compensating zeros for the system.

In one embodiment, at least one of the at least one additional compensating networks corresponds to an additional inductive compensation network.

In one embodiment, at least one of the at least one additional compensating networks corresponds to an additional capacitive compensation network.

In one embodiment, the circuit further includes at least one additional compensation network coupled between an operational amplifier output and the inverting terminals of the operational amplifier. In one embodiment at least one of the additional compensation networks corresponds to either a capacitive compensation network and/or an inductive compensation network.

In one embodiment, the inductive compensating network is disposed within the operational amplifier itself (i.e. the circuit includes an internal compensator).

In one embodiment, the is provided as an integrated circuit having on-chip inductors corresponding to frequency dependent compensation elements and wherein the parasitic series resistance of the inductor is used as part of the compensation.

In one embodiment, the circuit further includes a capacitive load coupled to an output of the operational amplifier. Thus, the concepts, circuits and techniques described herein are suitable for use with systems designed to drive capacitive loads.

In accordance with a still further aspect of the concepts described herein, an operational amplifier circuit having a pair of differential inputs and at least one output includes a pair of individual amplifiers and an internal inductive compensator disposed between the pair of individual amplifiers such that an inductive compensating network is coupled between the differential inputs of the operational amplifier circuit. In one embodiment, the internal inductive compensating network includes at least one inductive element having an inductance value selected so as to provide compensation of the operational amplifier.

In one embodiment, the internal inductive compensator comprises a resistive element and a capacitive element serially coupled with an inductive element.

In one embodiment, the circuit further includes at least one additional compensation network coupled between an operational amplifier output and the inverting terminals of the operational amplifier with each of the at least one additional compensation networks providing additional zeros necessary for proper compensation.

In one embodiment, the additional compensation network provides compensation independent of the inductive compensating network coupled between the differential inputs of the operational amplifier.

In one embodiment, the inductive compensation network and the at least one additional compensating networks are combined to provide three compensating zeros for the circuit.

In one embodiment, at least one of the additional compensating networks corresponds to an additional inductive compensation network.

In one embodiment, at least one of the additional compensating networks corresponds to an additional capacitive compensation network.

In one embodiment, the circuit further includes at least one additional compensation network coupled between an operational amplifier output and the inverting terminals of the operational amplifier, wherein at least one of the at least one additional compensation networks corresponds either a capacitive compensation network and/or an inductive compensation network.

In accordance with a still further aspect of the concepts described herein, an integrated circuit includes an operational amplifier having differential inputs and at least one output; and an inductive compensating network coupled between the differential inputs of the operational amplifier circuit. In one embodiment, the inductive compensating network includes at least one inductive element having an inductance value selected so as to provide compensation of said operational amplifier.

In one embodiment, the circuit further includes at least one additional compensation network coupled between an operational amplifier output and the inverting terminals of the operational amplifier with each of the at least one additional compensation networks providing additional zeros necessary for proper compensation.

BRIEF DESCRIPTION OF THE DRAWINGS

The foregoing features of the concepts, circuits, system and techniques described herein may be more fully understood from the following description of the drawings in which.

DETAILED DESCRIPTION OF ILLUSTRATIVE EMBODIMENTS

The concepts, circuits and techniques described herein provide a system and method whereby a lead compensator can be added to a feedback amplifier through the use of an inductive element. It should be appreciated that all embodiments described herein utilize inductive compensation between differential input terminals of an amplifier, whereas prior art techniques use only capacitors, or use inductors elsewhere (i.e. other than coupled between differential input terminals of an amplifier). It should, however, be appreciated that in an effort to promote clarity in drawings and in the written description provided herein, the inductive element is sometimes described herein as an inductor which is shunt-coupled between differential input terminals of an operational amplifier (op amp). In some exemplary embodiments the concept is exemplified using an inductor and resistor shunt-connected between differential input terminals of an op amp. It should be appreciated, of course, that the inductive element coupled between differential inputs may be provided in whole or in part from an inductor or from any other type of circuit element or any combination of circuit elements which emulate inductive behavior including, but not limited to, gyrator circuits. Thus, it should be understood that the concepts described herein may be achieved using an inductive element provided from reciprocal or non-reciprocal circuit elements or from a combination of both reciprocal or non-reciprocal circuit elements. It should be understood that the concepts described herein may be achieved using an inductive element provided from passive or active circuit elements or from a combination of both passive and active circuit elements (in combination with reciprocal or non-reciprocal circuit elements). Thus, in some circuit embodiments it may be desirable to use an inductor in the inductive compensation network, while in other embodiments, it may be desirable to utilize a gyrator circuit that emulates inductive behavior using capacitors, amplifiers and other circuit elements. It should thus be understood and appreciated that references made herein to an inductive element provided from an inductor coupled between differential inputs of an amplifier are not intended to be, and should not be construed as limiting and it is understood that in conjunction with the concepts described herein the inductive element may be implements from via a wide variety of different circuit designs.

It should also be understood that reference is sometimes made herein to use of an inductive feedback network with operational amplifiers. Such references are also made to promote clarity in the written description and the drawings and it is recognized that the concepts described can be applied to a wide range of amplification devices having differential inputs.

Figure 5:
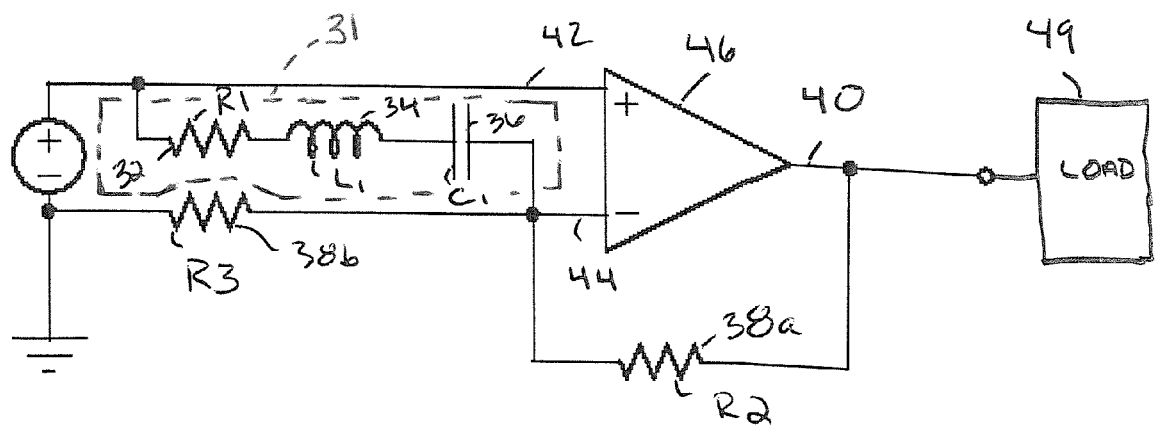
FIG. 5 is an exemplary schematic diagram of a lag-lead compensation system comprised of an operational amplifier having a compensation network coupled between its differential inputs.

Referring now to FIG. 5, an exemplary system includes an operation amplifier 46 having a pair of differential input terminals 42, 44 and at least one output terminal 40 coupled to a capacitive load 49. A lag-lead inductive compensation network 31 is serially coupled between the differential terminals 42 and 44 of op amp 46. In this exemplary embodiment, the inductive compensation network is provided from a resistor 32, an inductive element 34 (here shown as an inductor 34), and capacitor 36 which are serially coupled. Op amp output 40 is coupled through a feedback network provided from a pair of resistors 38a, 38b to drive inverting terminal 44 of op amp 46. The compensating network inductor 34 is provided having an inductance value selected so as to stabilize the system with a lead compensator.

It should be appreciated that the concepts, circuits and techniques described herein are not limited to use with single-ended op amps, but rather the concepts, circuits and techniques described herein are also suitable for use with amplifiers having two outputs. The system of FIG. 5 can be easily analyzed and understood through the corresponding block diagram depicted in FIG. 6.

Figure 6:
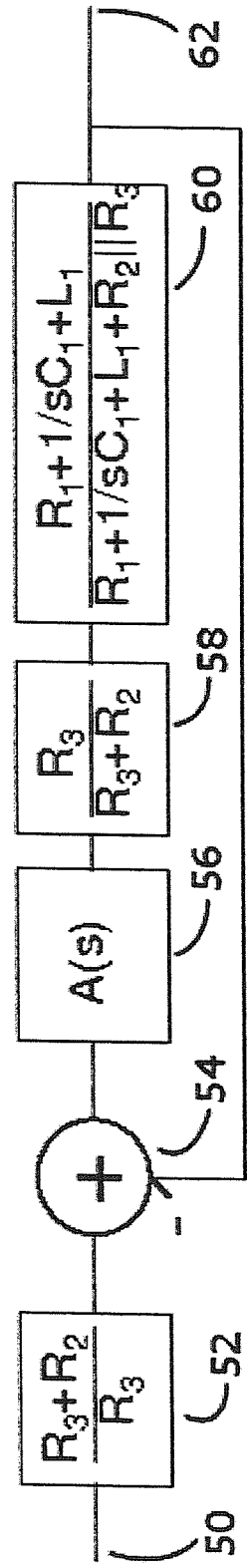
FIG. 6 is a block diagram representation of the lag-lead compensation system shown in FIG. 5.

Referring now to FIG. 6, a block diagram representation of the circuit of FIG. 5 includes an input 50 which leads to the ideal gain block 52 which in turn is coupled to a non-inverting input of a summing junction 54. The output of summing junction 54 is coupled to stages 56, 58, 60. An output of stage 60 leads to output 62 and a feedback path couples output 62 to an inverting terminal of summing junction 54. As is apparent from FIG. 6, the compensation block 60 only appears in the feedback loop. Therefore, as the amplifier gain 56 is increased, the overall response approaches the response of the ideal gain block 52 outside of the feedback loop independent of the compensator values.

Figure 1:
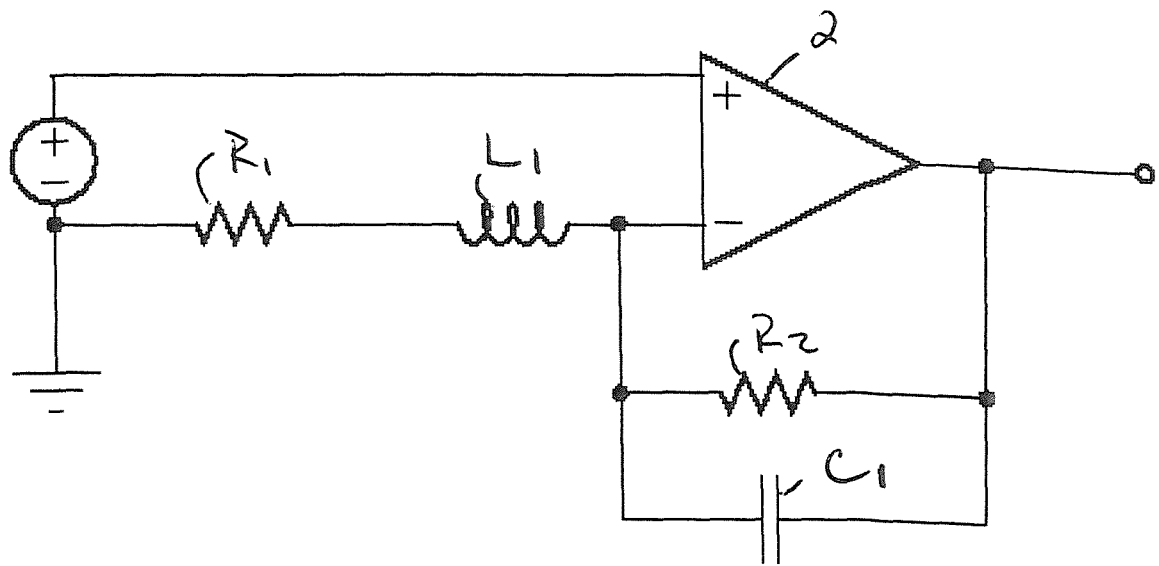
FIG. 1 is a diagrammatic schematic of a non-inverting prior art compensation system that uses both inductors and capacitors to provide two lead compensators for the same op amp.
Figure 2:
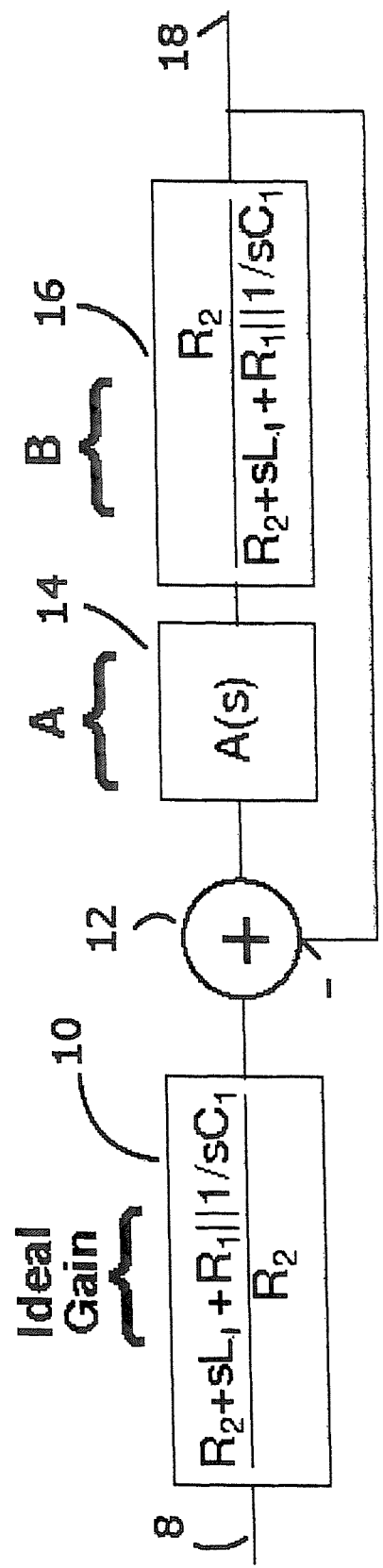
FIG. 2 is an illustrative block diagram representation of the diagrammatic schematic view of the prior art lead compensation system shown in FIG. 1.
Figure 3:
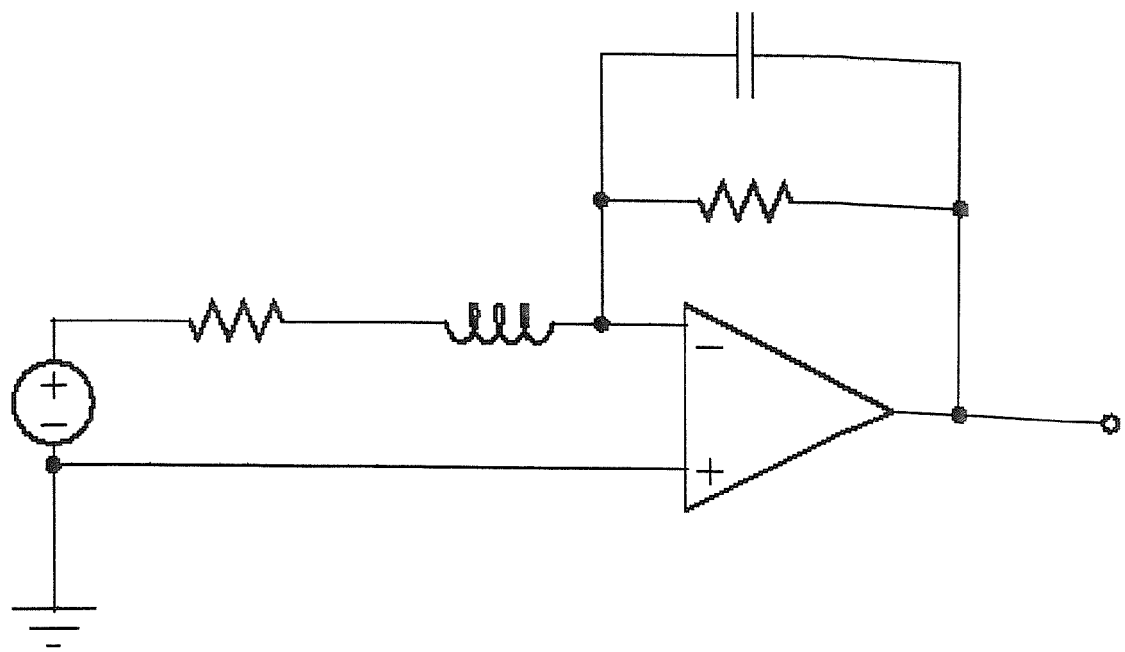
FIG. 3 is a diagrammatic schematic of an inverting prior art compensation system that uses both inductors and capacitors to provide two lead compensators for the same op amp.
Figure 4:
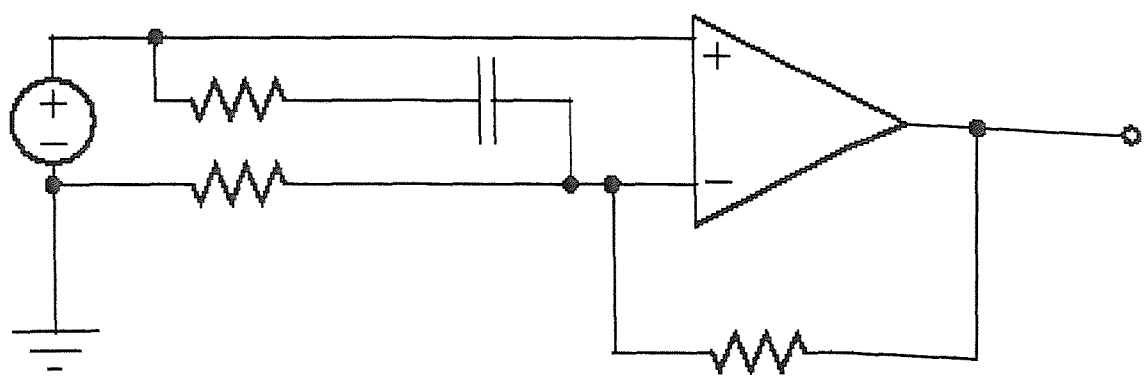
FIG. 4 is a diagrammatic schematic of a non-inverting prior art compensation system that uses a resistor and capacitor shunt to provide lag compensation.

Comparing the system of FIG. 5 and its associated block diagram depicted in FIG. 6 to the prior art depicted in FIG. 1, and its associated block diagram depicted in FIG. 2, it is clear that the closed-loop independence discussed above in conjunction with FIGS. 5 and 6, does not apply to the prior art system depicted in FIG. 1, and its associated block diagram depicted in FIG. 2. Once again, in the system of FIG. 1, as the amplifier gain 14 increases the closed loop response approaches that outside of the feedback loop 10. However, the overall response 10 of the FIG. 1 system remains a function of the compensator values thereby complicating the design and drastically degrading the performance of the device.

Figure 7:
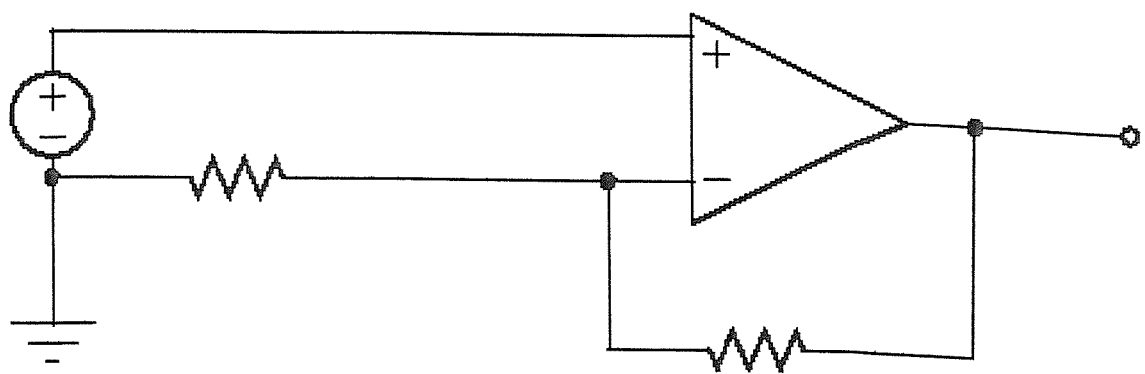
FIG. 7 Is an uncompensated, unstable circuit used as a control in demonstrating the use of the concepts, circuits, systems and techniques described herein.

Referring now to FIG. 7, a control system used to test the efficacy of the compensation scheme depicted in FIG. 5 is shown. The system shown in FIG. 7 is marginally unstable.

Figure 8:
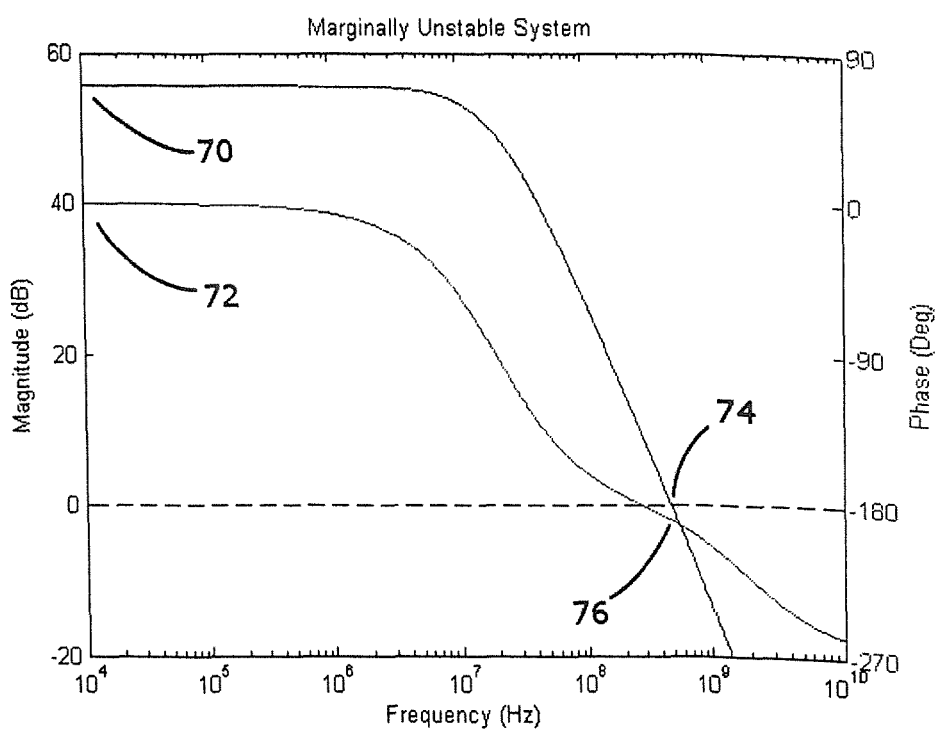
FIGS. 8 and 9 show illustrative graphical views of the difference between the open loop transfer function of a system before and after an embodiment of the concepts, circuits, systems and techniques described herein are employed, corresponding to FIG. 7 and FIG. 5 respectively.

FIG. 8 is a plot of the loop transmission's gain and phase vs. frequency for the marginally unstable system depicted in FIG. 7. The curve designated by reference numeral 70 corresponds to the open loop gain of such a system. The curve designated by reference numeral 72 corresponds to the open loop phase of such a system. Reference numeral 74 corresponds to the crossover frequency of the system. Since the phase curve 72 is below zero at crossover frequency 74, the phase margin is likewise negative and without compensation the amplifier will be unstable. The distance between curve 70 and 72 at the frequency specified by reference numeral 74 is designated 76 and corresponds to the phase margin of the system.

Figure 9:
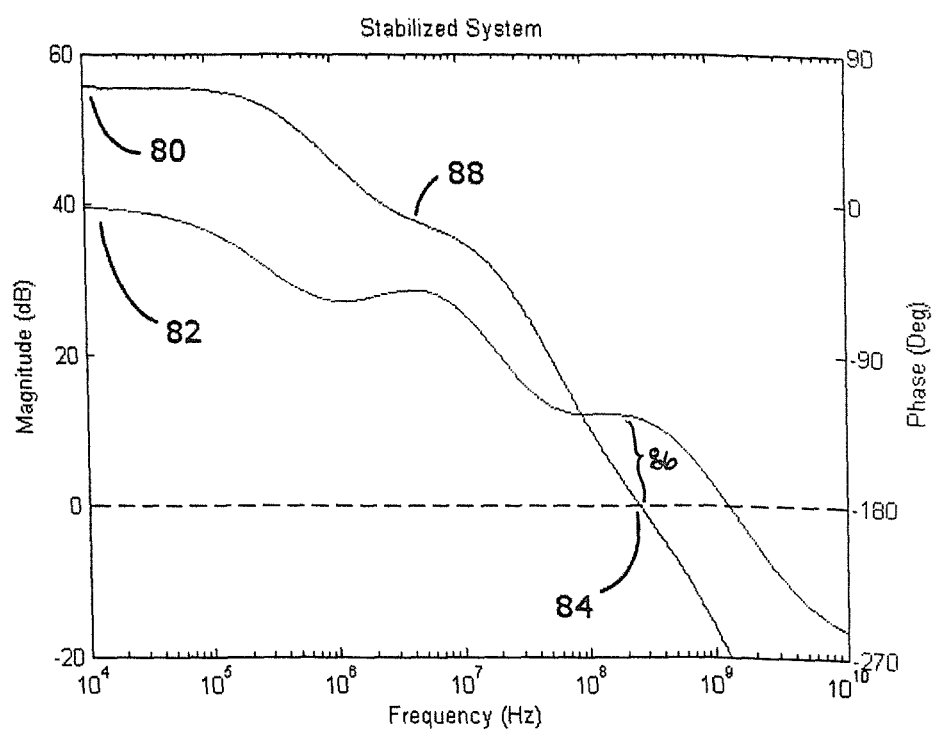

FIG. 9 is a plot of both magnitude and phase vs. frequency for the loop transmission of the system of FIG. 5. The curve designated by reference numeral 80 corresponds to open loop gain of the system. The curve designated by reference numeral 82 corresponds to the open loop phase of the system. Reference numeral 84 corresponds to the crossover frequency of the system. The distance between curves 80 and 82 at the crossover frequency 84 represents the phase margin, and is labeled with reference numeral 86.

Comparing the loop transmission simulations of FIG. 8 and FIG. 9 reveals that a working implementation of the inductive compensation concepts, circuits and techniques described herein effectively compensates the system by increasing the phase margin from −4 degrees (as designated by reference numeral 76 in FIG. 8) to 61 degrees (as designated by reference numeral 86 in FIG. 9).

Figure 10:
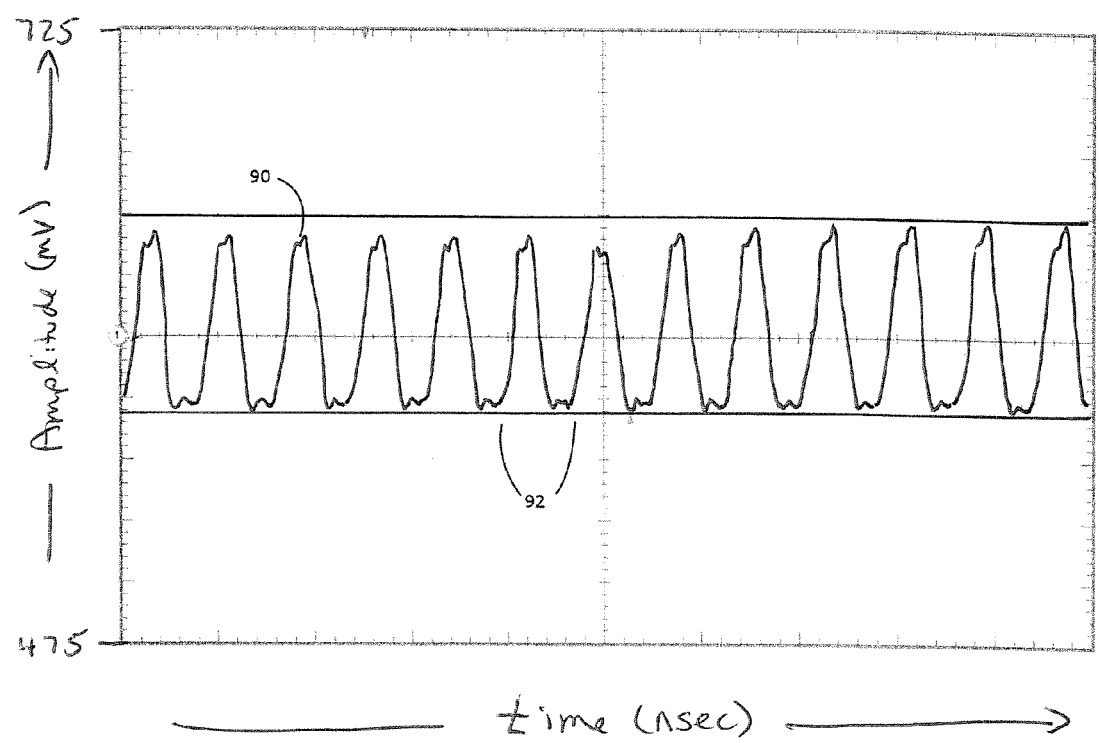
FIGS. 10 and 11 show illustrative graphical views of the difference between the step response of a system before and after an embodiment of the concepts, circuits, systems and techniques described herein is employed, corresponding to FIG. 7 and FIG. 5 respectively.
Figure 11:
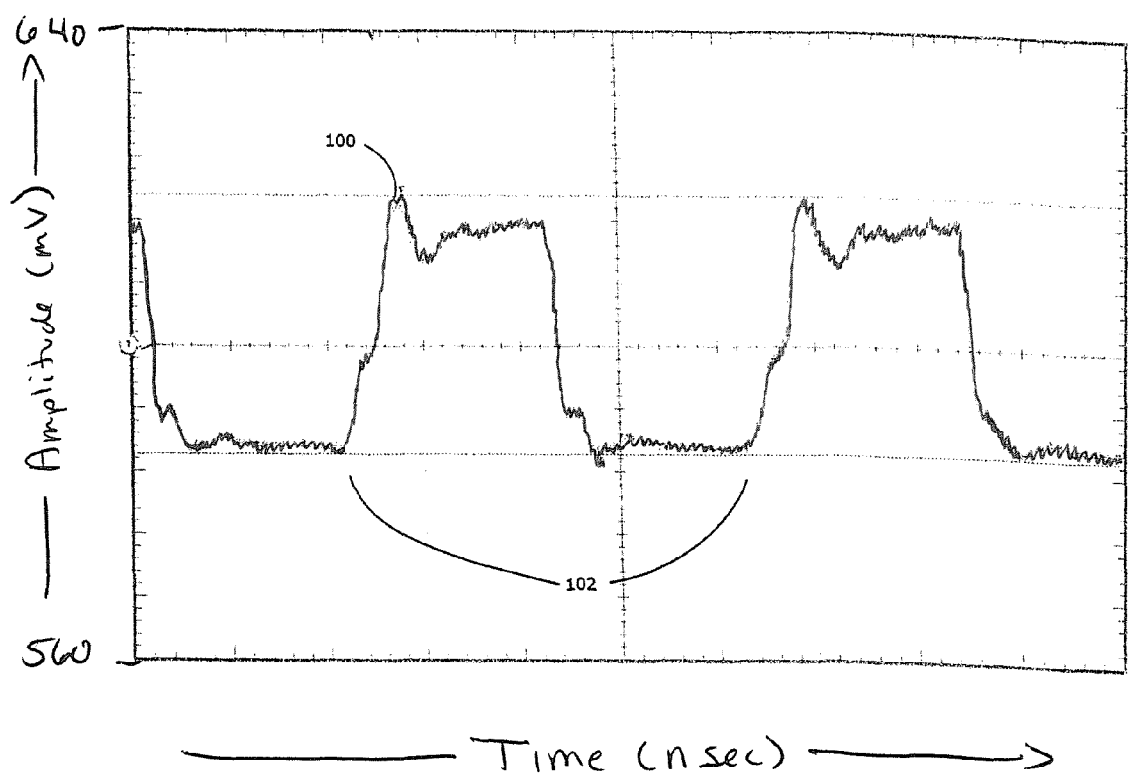

Furthermore, data derived from an implementation of the inductive compensation concepts, circuits and techniques described herein and provided in FIG. 10 and FIG. 11 illustrate the compensation ability of the inductive compensation concepts, circuits and techniques described herein.

FIGS. 10 and 11 graphically illustrate the difference between the step response of a system before (FIG. 10) and after (FIG. 11) the application of inductive compensation as described herein.

In FIG. 10, the horizontal axis is 5 ns/division, or 50 ns total and the vertical axis is 25 mV/division and extends from 475 mV to 725 mV. In FIG. 11 the horizontal axis is 50 ns/division, and the vertical axis is 10 mV/division and extends from 560 mV to 640 mV.

FIG. 11, is a plot of a properly compensated system (i.e. a system utilizing a compensation scheme such as that described above in conjunction with FIG. 5) driven by an 80 MHz square wave. Driving the same system without the application of inductive compensation as described herein yields an unstable oscillation, as shown in FIG. 10, in which the oscillation frequency 90 is independent of the drive frequency. Thus, FIG. 10 is a plot of an unstable oscillation. As can be seen from FIG. 11, the period of the oscillation, designated by reference number 92, is not anywhere close to 80 MHz, thus proving that the system is unstable.

Figure 12:
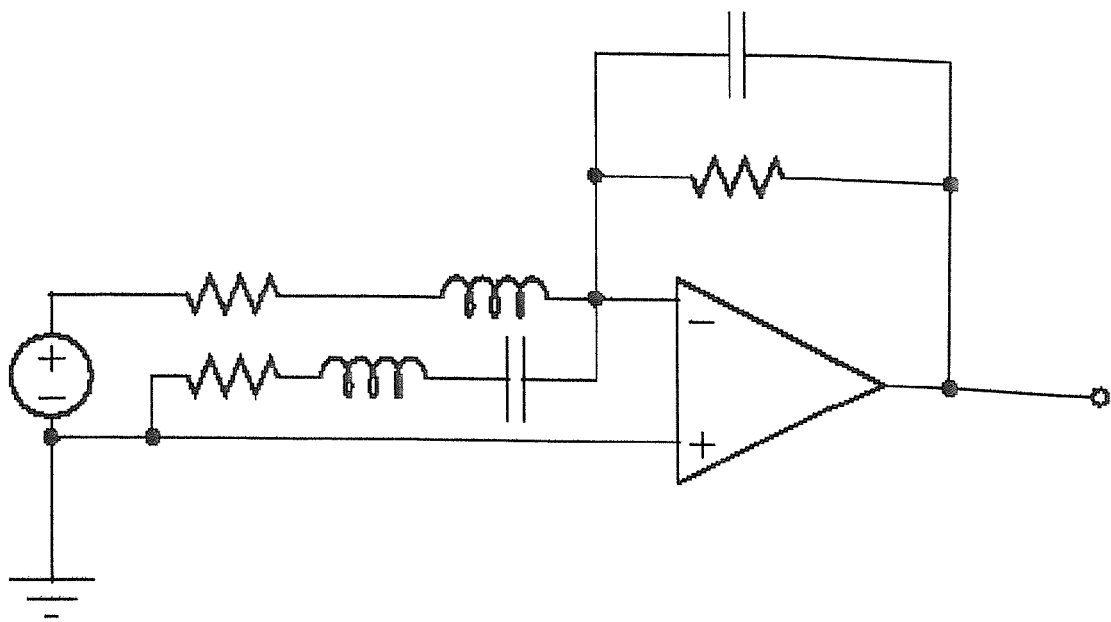
FIG. 12 shows an illustrative diagrammatic schematic view of a three lead compensators applied around a single system in accordance with a further embodiment of the concepts, circuits, systems and techniques described herein.

Referring now to FIG. 12, a circuit embodiment which utilizes three lead compensators applied around a single op amp is shown. The embodiment of FIG. 12 combines the circuit embodiment of FIG. 5 and the prior art circuit embodiment of FIG. 1 into a single amplification stage. Through such a combination, it is easy to produce much more aggressive compensators with only a single amplifier stage as is apparent from FIG. 13.

Figure 13:
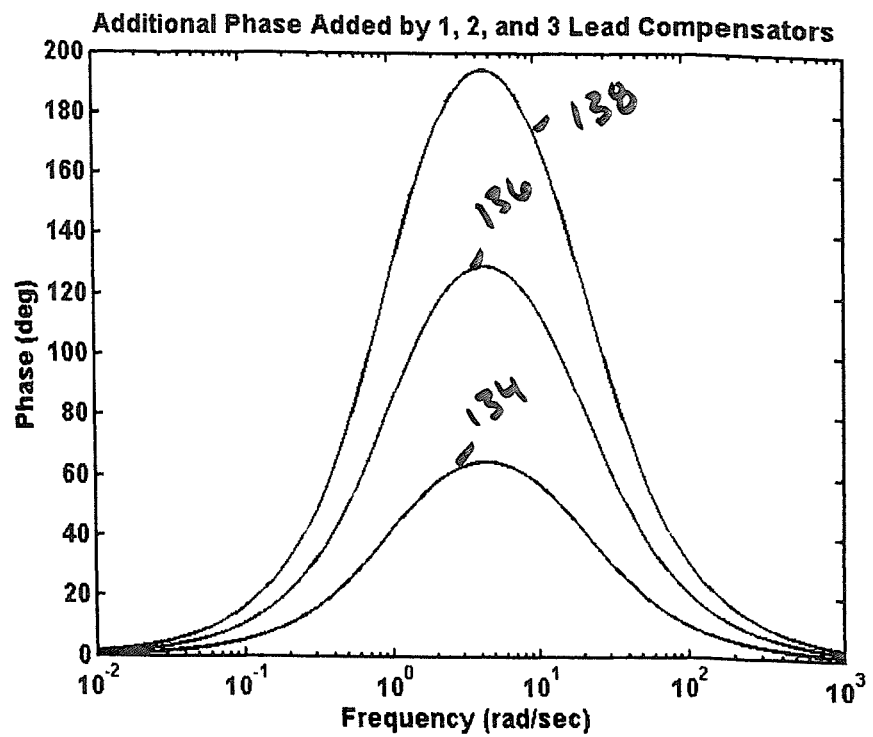
FIG. 13 shows an illustrative graphical representation of the additional phase provided by the embodiment of FIG. 12.

Referring now to FIG. 13, a plot of compensator phase vs. frequency illustrates compensator responses achievable with the circuit embodiment of FIG. 12. In FIG. 13, curve 134 depicts phase compensation with a single lead compensator, curve 136 depicts compensation with the prior art circuit of FIG. 1, and curve 138 depicts compensation with the circuit embodiment depicted in FIG. 12. As is apparent from curves 134, 136, 138, the circuit of FIG. 12 which utilizes the inductive compensation scheme described herein allows one to achieve a much larger compensation than is possible with prior art circuits, systems and techniques. Thus, the circuits, systems and techniques described herein can be used to produce a much more aggressive compensator around a single amplifier stage.

Figure 14:
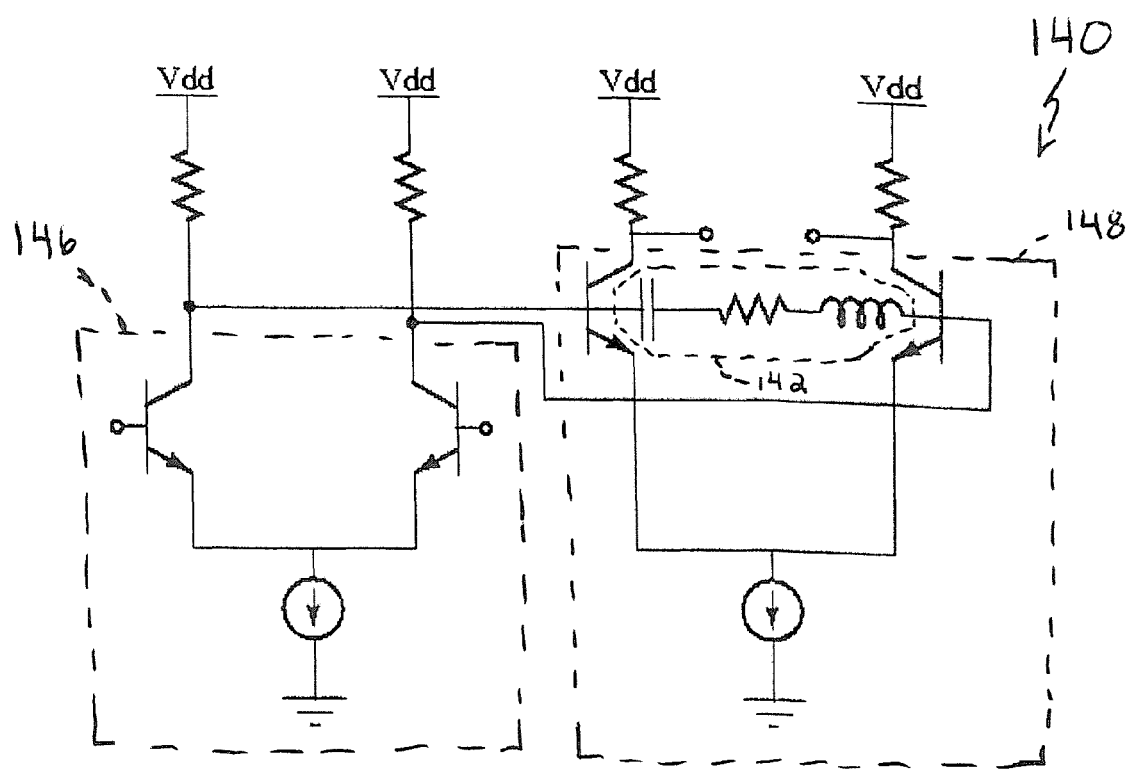
FIG. 14 shows an illustrative diagrammatic schematic view of a lag-lead compensator internal to the packaging of the circuit in accordance with a further embodiment of the concepts, circuits, systems and techniques described herein.

Referring now to FIG. 14, an amplifier 140 includes an internal compensator 142 disposed between individual amplifiers 146, and 148, and is thus invisible to the end-user. Internal compensator 142 includes an inductive element. In this exemplary embodiment, Internal compensator 142 includes a resistive element and a capacitive element serially coupled with the inductive element. It should be appreciated that other circuit topologies may, of course, be used as long as the circuit topologies include an inductor for providing a zero between the two differential terminals. Utilizing an internal compensator dramatically increases the ease of use and implementation of the amplifier without sacrificing amplifier performance.

The foregoing description has been directed toward several specific embodiments. It should, however, be apparent that variations and modifications may be made to the described embodiments, with the attainment of some or all of their advantages. For instance, it is expressly contemplated that certain components and/or elements described herein can be implemented other than as specifically shown. Accordingly, it is submitted that the concepts and techniques described herein should not be limited to the described embodiments but rather should be limited only by the spirit and scope of the appended claims.

What is claimed is:

1. A circuit comprising:
    an operational amplifier having differential inputs and at least one output; and
    an inductive compensating network coupled between the differential inputs of said operational amplifier circuit, said inductive compensating network comprising at least one inductive element having an inductance value selected so as to provide compensation of said operational amplifier.

2. The circuit of claim 1 further comprising at least one additional compensation network coupled between an operational amplifier output and the inverting terminals of said operational amplifier, each of said at least one additional compensation networks providing additional zeros necessary for proper compensation.

3. The circuit of claim 2 wherein said additional compensation network provides compensation independent of the inductive compensating network coupled between differential inputs of said operational amplifier.

4. The circuit of claim 3 wherein said inductive compensation network and said at least one additional compensating networks are combined to provide three compensating zeros for the system.

5. The circuit of claim 4 wherein at least one of said at least one additional compensating networks corresponds to an additional inductive compensation network.

6. The circuit of claim 4 wherein at least one of said at least one additional compensating networks corresponds to an additional capacitive compensation network.

7. The circuit of claim 1 further comprising at least one additional compensation network coupled between an operational amplifier output and the inverting terminals of said operational amplifier, wherein at least one said at least one additional compensation networks corresponds to one of: a capacitive compensation network; or an inductive compensation network.

8. The circuit of claim 1 wherein said inductive compensating network is disposed within the operational amplifier itself.

9. The circuit of claim 1 comprising an integrated circuit comprising on-chip inductors corresponding to frequency dependent compensation elements, whereby the parasitic series resistance of the inductor is used as part of the compensation.

10. The circuit of claim 1 further comprising a capacitive load coupled to an operational amplifier output.

11. An operational amplifier circuit having a pair of differential inputs and at least one output, said operational amplifier circuit comprising:
  a pair of individual amplifiers;
  an internal inductive compensator disposed between said pair of individual amplifiers such that an inductive compensating network is coupled between the differential inputs of the operational amplifier circuit, said internal inductive compensating network comprising at least one inductive element having an inductance value selected so as to provide compensation of said operational amplifier.

12. The circuit of claim 11 wherein said internal inductive compensator comprises a resistive element and a capacitive element serially coupled with an inductive element.

13. The circuit of claim 12 further comprising at least one additional compensation network coupled between an operational amplifier output and the inverting terminals of the operational amplifier, each of said at least one additional compensation networks providing additional zeros necessary for proper compensation.

14. The circuit of claim 13 wherein said additional compensation network provides compensation independent of the inductive compensating network coupled between the differential inputs of said operational amplifier.

15. The circuit of claim 13 wherein said inductive compensation network and said at least one additional compensating networks are combined to provide three compensating zeros for the circuit.

16. The circuit of claim 13 wherein at least one of said at least one additional compensating networks corresponds to an additional inductive compensation network.

17. The circuit of claim 13 wherein at least one of said at least one additional compensating networks corresponds to an additional capacitive compensation network.

18. The circuit of claim 11 further comprising at least one additional compensation network coupled between an operational amplifier output and the inverting terminals of said operational amplifier, wherein at least one said at least one additional compensation networks corresponds to one of: a capacitive compensation network; or an inductive compensation network.

19. A integrated circuit comprising:
  an operational amplifier having differential inputs and at least one output; and
  an inductive compensating network coupled between the differential inputs of said operational amplifier circuit, said inductive compensating network comprising at least one inductive element having an inductance value selected so as to provide compensation of said operational amplifier.

20. The integrated circuit of claim 19 further comprising at least one additional compensation network coupled between an operational amplifier output and the inverting terminals of said operational amplifier, each of said at least one additional compensation networks providing additional zeros necessary for proper compensation.

* * * * *